（12） United States Patent
Chen

(10) Patent No.: US 9,202,750 B2
(45) Date of Patent: Dec. 1, 2015

(54) STACKED 3D MEMORY WITH ISOLATION LAYER BETWEEN MEMORY BLOCKS AND ACCESS CONDUCTORS COUPLED TO DECODING ELEMENTS IN MEMORY BLOCKS

(71) Applicant: MACRONIX INTERNATIONAL CO., LTD., Hsinchu (TW)

(72) Inventor: Shih-Hung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/069,151

(22) Filed: Oct. 31, 2013

(65) Prior Publication Data

US 2015/0115455 A1 Apr. 30, 2015

(51) Int. Cl.
H01L 23/48 (2006.01)
H01L 21/768 (2006.01)
H01L 27/115 (2006.01)

(52) U.S. Cl.
CPC .... H01L 21/76895 (2013.01); H01L 27/11548 (2013.01); H01L 27/11556 (2013.01); H01L 27/11575 (2013.01); H01L 27/11582 (2013.01)

(58) Field of Classification Search
CPC .............................. H01L 21/768; H01L 27/10
USPC .................... 257/202, 324, E21.586, E27.07, 257/E29.309; 438/128, 675
See application file for complete search history.

(56) References Cited

U.S. PATENT DOCUMENTS

| 6,119,226 | A  | * | 9/2000  | Shiau et al. ...................... 713/2 |
| 8,363,476 | B2 |   | 1/2013  | Lue et al. |
| 8,482,052 | B2 |   | 7/2013  | Lue et al. |
| 8,503,213 | B2 |   | 8/2013  | Chen et al. |
| 2006/0097341 | A1 | * | 5/2006  | Pellizzer et al. ............... 257/528 |
| 2007/0257300 | A1 | * | 11/2007 | Ho et al. ......................... 257/315 |
| 2008/0121861 | A1 | * | 5/2008  | Lai et al. ............................ 257/4 |
| 2010/0226195 | A1 | * | 9/2010  | Lue .......................... 365/230.06 |
| 2013/0334575 | A1 | * | 12/2013 | Chen et al. .................... 257/202 |
| 2014/0231954 | A1 | * | 8/2014  | Lue ............................... 257/528 |
| 2015/0004763 | A1 | * | 1/2015  | Lue ................................ 438/257 |

OTHER PUBLICATIONS

Jung et al., "Three Dimensionally Stacked NAND Flash Memory Technology Using Stacking Single Crystal Si Layers on ILD and TANOS Sructure for Beyond 30nm Node," IEEE IEDM, Dec. 11-13, 2006, 4 pages.

Lai et al., "A Multi-Layer Stackable Thin-Film Transistor (TFT) Nand-Type Flash Memory", IEEE Int'l Electron Devices Meeting, Dec. 11-13, 2006.

(Continued)

*Primary Examiner* — Caleb Henry
(74) *Attorney, Agent, or Firm* — Kenta Suzue; Haynes Beffel & Wolfeld LLP

(57) ABSTRACT

A memory can include a plurality of memory blocks, including a first block and a second block disposed over the first block. An isolation layer is disposed in this structure, between the first and second blocks to isolate the vertical conductors in the memory kernels of the first and second blocks. Access conductors are provided outside the kernels, such as adjacent the memory blocks or through regions of the blocks that only include decoding element. The access conductors are coupled to the decoding elements in the first and second blocks, and provide for connection of the memory cells to peripheral circuits.

27 Claims, 12 Drawing Sheets

(56) References Cited

OTHER PUBLICATIONS

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 13/721,523, entitled Memory Device Structure with Decoders in a Device Level Separate From the Array Level, filed on Dec. 20, 2012, 28 pages.

U.S. Appl. No. 13/772,058, entitled 3D NAND Flash Memory, filed on Feb. 20, 2013, 70 pages.

\* cited by examiner

STACKED 3D MEMORY WITH ISOLATION LAYER BETWEEN MEMORY BLOCKS AND ACCESS CONDUCTORS COUPLED TO DECODING ELEMENTS IN MEMORY BLOCKS

BACKGROUND

1. Field of the Invention

The present invention relates to high density memory technologies, including technologies that include three-dimensional 3D arrays of memory cells.

2. Description of Related Art

High density flash memory is used for nonvolatile storage in many systems. One popular architecture is known as NAND flash, and is usually implemented in a two-dimensional array of memory cells. As the manufacturing technology advances to smaller and smaller nodes, it is widely believed that two-dimensional NAND flash is reaching physical limitations. Thus, a wide variety of other technologies is being explored.

In one trend to achieve high density memory for flash memory and other types of memory, designers have been looking to techniques for stacking multiple levels of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006. See also, U.S. Pat. No. 8,482,052, by Lue et al., entitled "Silicon on Insulator and Thin Film Transistor Bandgap Engineered Split Gate Memory."

In a second approach, flash memory has been implemented using vertical gate structures that are shared among many levels or memory cells. One 3D Vertical Gate (3DVG) architecture is described in U.S. Pat. No. 8,503,213 issued 6 Aug. 2013 (filed 1 Apr. 2011), entitled "Memory Architecture Of 3D Array With Alternating Memory String Orientation And String Select Structures," by inventors Shih-Hung Chen and Hang-Ting Lue, which is incorporated by reference as if fully set forth herein.

In a third approach, flash memory has been implemented using vertical channel structures that are shared among many levels of memory cells. See for example, commonly owned U.S. Pat. No. 8,363,476, issued 29 Jan. 2013 (filed 19 Jan. 2011), entitled "Memory Device, Manufacturing Method And Operating Method Of The Same," by inventors Hang-Ting Lue and Shi-Hung Chen. See, also, U.S. patent application Ser. No. 13/772,058, entitled "3D NAND Flash Memory," filed 20 Feb. 2013, by inventor Hang-Ting Lue, which is incorporated by reference as if fully set forth herein.

Another structure that provides vertical channel structures for NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15.

All of these 3D technologies have practical limits on the number of layers of memory cells that can be implemented, while maintaining reliable operation. The simple stacking approach is costly because each layer of the stack must be separately patterned. The vertical gate and vertical channel structures, or other structures that include vertical conductors that extend through multiple layers of memory cells, may be more cost effective, because many layers can be patterned using one mask and etch process. However, limitations arise because high aspect ratio structures are hard to etch, intermediate structures may break during processing, and so on.

It is desirable therefore to provide technologies that support stacking 3D blocks of memory cells to overcome some of the limitations in the number of layers that can be reliably achieved.

SUMMARY

A technology is provided for stacking 3D blocks of memory cells.

A stacked structure is described that addresses the different structures in the 3D blocks, including structures in a memory kernel and structures of decoding elements coupled to the kernel. A memory kernel is at the core of the structure of a memory block, and decoding elements are connected to the kernel. Conductors in the kernel can be classified in two ways, (1) conductors such as bit lines which conduct signals representing data, and (2) conductors such as word lines which conduct control signals. Decoding elements in the kernel are connected to both types of conductors, and can include string or block select transistors, ground select transistors, stairstep structures for linking horizontal conductors in the kernel with vertical conductors outside the kernel for connection to peripheral circuits, and so on.

A memory can include a plurality of memory blocks, including a first block and a second block disposed over the first block. An isolation layer is disposed, in this structure, between the first and second blocks to isolate the memory kernels of the first and second blocks. Access conductors are provided outside the kernels, such as adjacent the memory blocks or through regions of the blocks that only include decoding elements. The access conductors are coupled to the decoding elements in the first and second blocks, and provide for connection of the memory cells to peripheral circuits.

By isolating the connectors in one kernel from those in a stack above it, the stacked structure can be made with fewer inter-block connections. Also, by providing access conductors that are connected only to decoding elements, larger connection sizes can be used for access conductors than can be used in the memory kernel.

Other aspects and advantages of the present technology can be seen on review of the drawings, the detailed description and the claims, which follow.

DETAILED DESCRIPTION

A detailed description of embodiments of the present invention is provided with reference to the FIGS. 1-16.

Figure 1:
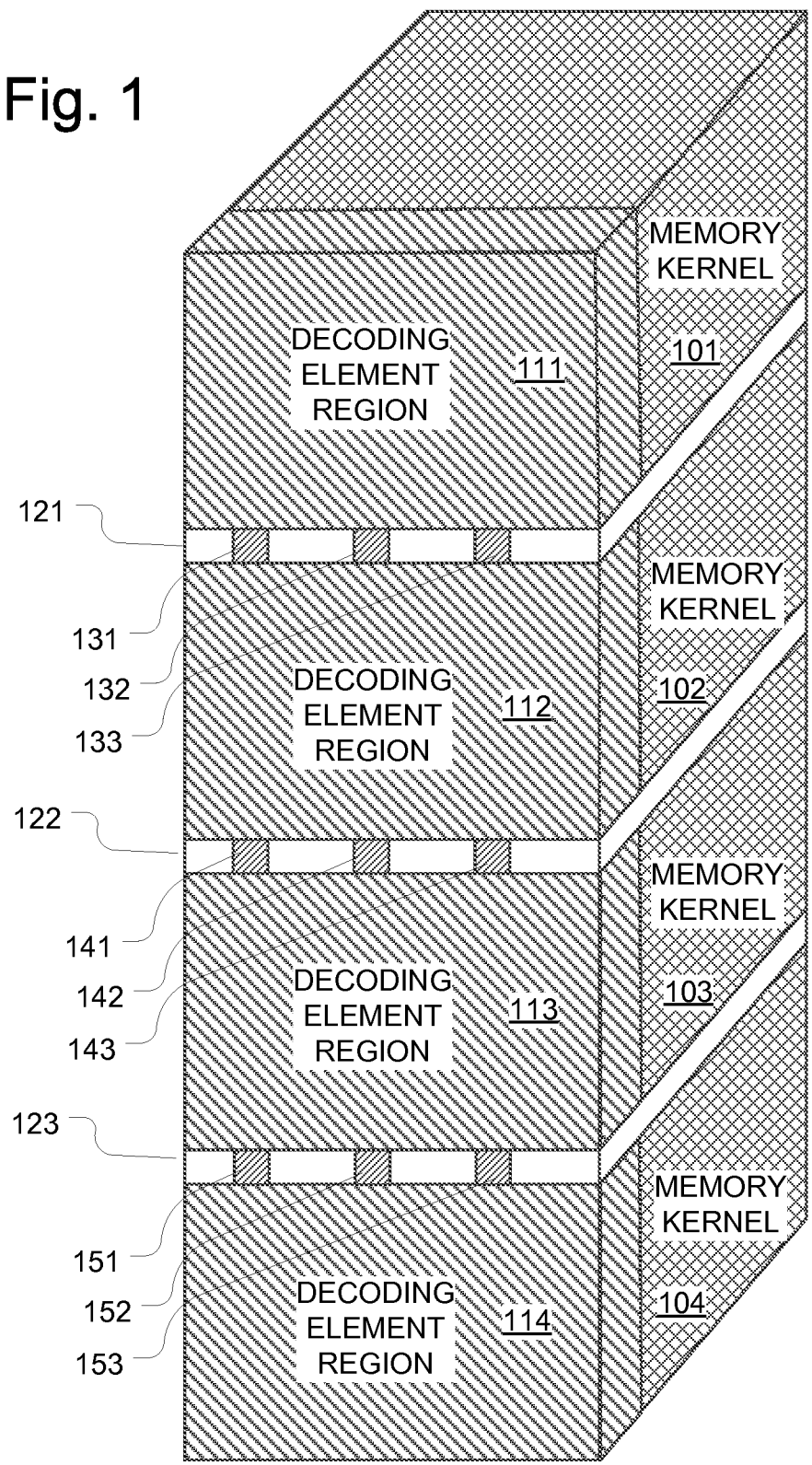
FIG. 1 is a simplified diagram of a stack 3D memory blocks including isolation layers with decoding element interconnections.

FIG. 1 is a simplified diagram of a stacked 3D memory that comprises a plurality of memory blocks. The illustrated structure includes a first block that comprises a memory kernel 104 and the decoding element region 114. The second block disposed over the first block includes memory kernel 103 and decoding element region 113. A third block disposed over the second block includes memory kernel 102 and decoding element region 112. A fourth block in the illustrated stack includes memory kernel 101 and decoding element region 111. An isolation layer (e.g., 123) is disposed between the blocks. Access conductors are configured in the decoding element regions 111-114. Segments of the access conductors are disposed in the isolation layers 121-123. In this illustration, segments 151-153 of access conductors are disposed in the isolation layer 123 between the second block and the first block. Segments 141-143 of access conductors are disposed in the isolation layer 122 between the third block and the second block. Segments 131-133 of access conductors are disposed in the isolation layer between the fourth block in the third block.

In this illustration, the decoding element regions (e.g. 111) are shown on only one side of the memory kernel (e.g. 101). In other embodiments, the decoding element regions can be distributed in other configurations, including regions on two sides of the memory kernel, regions on all sides of the memory kernel, and so on.

This technology can be applied advantageously when the memory kernels are manufactured according to a first design rule, including feature sizes of the vertical conductors through the kernels, selected to implement very dense memory cell structures, while the decoding elements in the memory blocks are manufactured according to a larger second design rule that is characterized by feature sizes that are larger than those of the vertical conductors through the kernels.

The isolation layers can limit the effect of damaged memory cells in a particular block on the operation of other blocks in the stack, by separating the vertical conductors that are manufactured with a very tight design rule within the kernels. Also, by preventing connections between the kernels in the blocks, any damage in one block will not be multiplied by shared conductors through the kernels. In addition, the isolation layers can limit the scope of the effects of any misalignment defects that arise during manufacturing.

Figure 2:
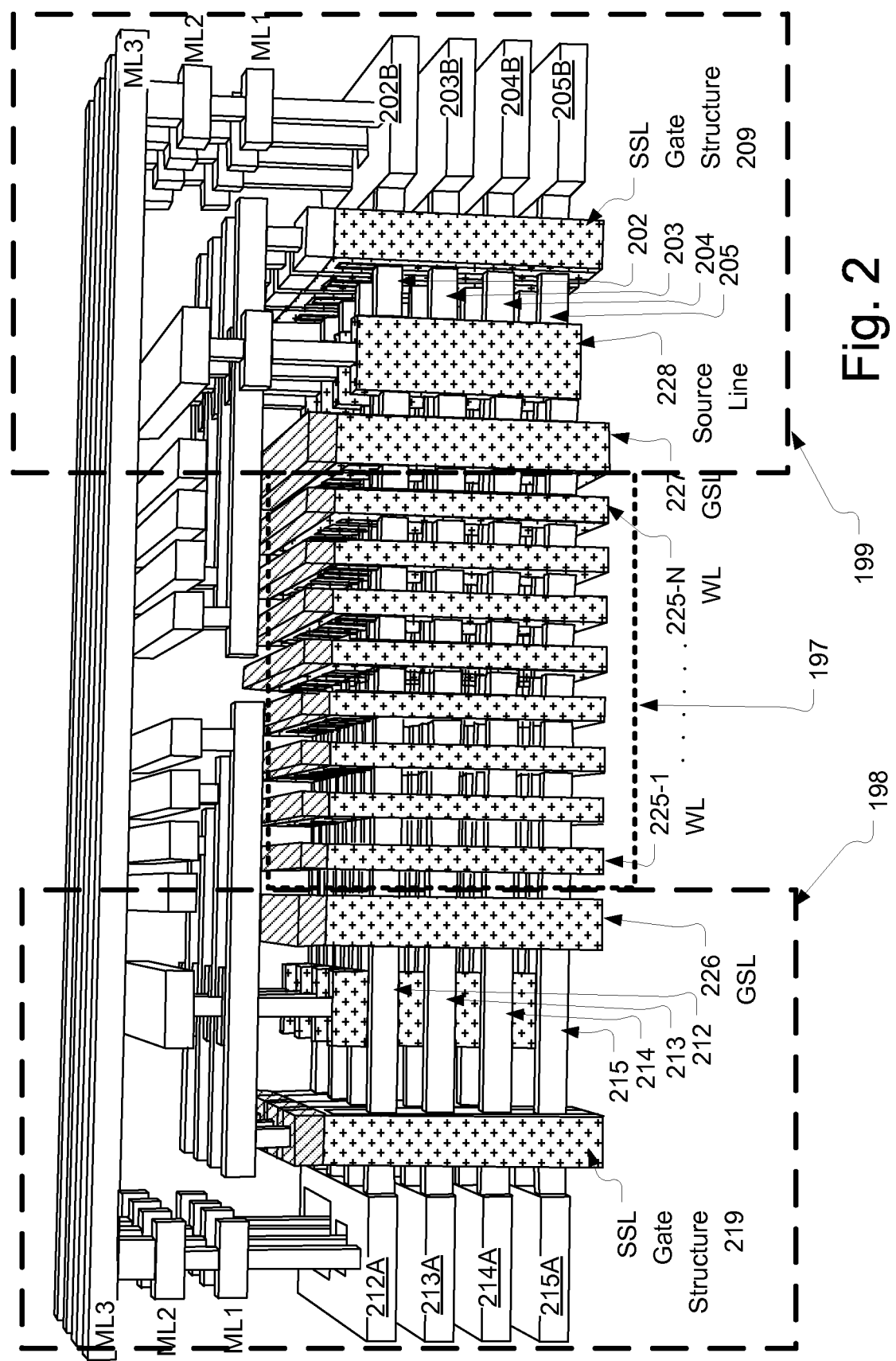
FIG. 2 is a perspective diagram of a 3D block of memory cells in a 3D vertical gate configuration, with a kernel and decoding element regions, which is suitable for stacking as described herein.
Figure 3:
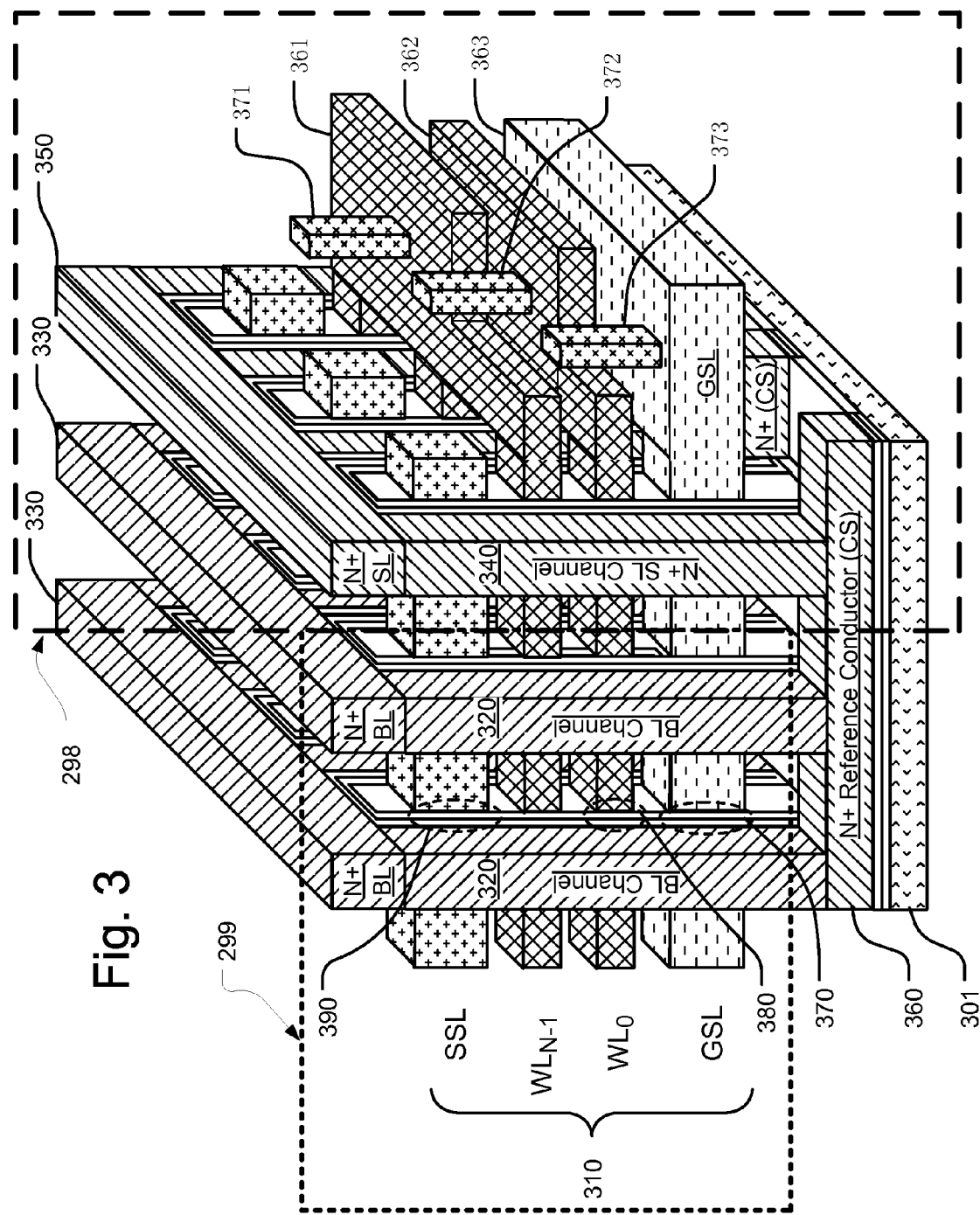
FIG. 3 is a perspective diagram of a 3D block of memory cells in a 3D vertical channel configuration, with a kernel and decoding element regions, which is suitable for stacking as described herein.

As mentioned above, the memory blocks can comprise vertical channel or vertical gate 3D structures. FIGS. 2 and 3 illustrate 3DVG and 3DVC blocks that can be stacked using the technology described herein. Also, these figures show structures in a memory kernel which can be made using small design rules, and decoding elements in decoding element regions of the blocks that are coupled to the memory kernel and can be made using larger design rules.

FIG. 2 illustrates a memory block with a 3D vertical gate (3DVG) architecture, as described in U.S. Patent Application Publication No. US 2012/0007167, published 12 Jan. 2012, and filed 31 Jan. 2011, entitled "3D Memory Array With Improved SSL and BL Contact Layout," which is incorporated by reference as if fully set forth herein.

Insulating material is removed from the drawing to expose additional structure. For example, insulating layers are removed between the semiconductor strips, in the ridge-shaped stacks, and are removed between the ridge-shaped stacks of semiconductor strips. The decoding element regions are indicated by the boxes 198 and 199. The memory kernel is indicated by the box 197.

The multilayer array is formed on an insulating layer. The kernel 197 includes a plurality of word lines 225-1, . . . , 225-n-1, 225-n including vertical extensions conformal with a plurality of ridge-shaped stacks. The plurality of ridge-shaped stacks includes horizontal semiconductor strips 212, 213, 214, 215 configured as channels for corresponding NAND strings in each layer of the block.

Decoding elements in the block include stairstep structures 212A, 213A, 214A, 215A in the decoding element region 198 and stairstep structures 202B, 203B, 204B, 205B in the decoding element region 199. The stairstep structures 212A, 213A, 214A, 215A terminate horizontal semiconductor strips, such as semiconductor strips 212, 213, 214, 215. As illustrated, these stairstep structures 212A, 213A, 214A, 215A are electrically connected by vertical conductors to different data lines that overlie the block, in this example at metal layer ML3, for connection to page buffers and other decoding circuitry to select planes within the array. These stairstep structures 212A, 213A, 214A, 215A can be patterned at the same time that the plurality of ridge-shaped stacks are defined, using a larger design rule than is used inside the kernel.

The stairstep structures 202B, 203B, 204B, 205B in the decoding element region 199 terminate semiconductor strips, such as semiconductor strips 202, 203, 204, 205. As illustrated, these stairstep structures 202B, 203B, 204B, 205B are electrically connected to different data lines for connection to page buffers and other decoding circuitry to select planes within the array. These stairstep structures 202B, 203B, 204B, 205B can be patterned at the same time that the plurality of ridge-shaped stacks are defined, using a larger design rule than is used inside the kernel.

Any given stack of semiconductor strips in the kernel 197 is coupled to either the stairstep structures 212A, 213A, 214A, 215A, or the stairstep structures 202B, 203B, 204B, 205B, but not both. A stack of semiconductor strips has one of the two opposite orientations of bit line end-to-source line end orientation, or source line end-to-bit line end orientation. For example, the stack of semiconductor strips 212, 213, 214, 215 has bit line end-to-source line end orientation; and the stack of semiconductor strips 202, 203, 204, 205 has source line end-to-bit line end orientation.

The stack of semiconductor strips 212, 213, 214, 215 is terminated at one end by the stairstep structures 212A, 213A, 214A, 215A, and passes through decoding elements in the region 198 including SSL gate structure 219 and ground select line GSL 226. Also, the stack of semiconductor strips 212, 213, 214, 215 passes through decoding elements in the region 199 including ground select line GSL 227, and source line 228 which terminate the strips. The stack of semiconductor strips 212, 213, 214, 215 does not reach the stairstep structures 202B, 203B, 204B, 205B.

The stack of semiconductor strips 202, 203, 204, 205 is terminated at one end by the stairstep structures 202B, 203B, 204B, 205B, and passes through decoding elements in the region 199 including SSL gate structure 209 and ground select line GSL 227. Also the stack of semiconductor strips 202, 203, 204, 205 passes through decoding elements in the region 198 including ground select line GSL 226, and a source line (obscured by other parts of figure). The stack of semiconductor strips 202, 203, 204, 205 does not reach the stairstep structures 212A, 213A, 214A, 215A.

A layer of memory material separates the word lines 225-1 through 225-n, from the semiconductor strips 212-215 and 202-205.

Ground select lines GSL 226 and GSL 227 include horizontal lines and vertical extensions which are conformal with the plurality of ridge-shaped stacks, similar to the word lines.

Every stack of semiconductor strips is terminated at one end by stairstep structures, and at the other end by a source line. For example, the stack of semiconductor strips 212, 213, 214, 215 is terminated at one end by stairstep structures 212A, 213A, 214A, 215A, and terminated on the other end by source line 228. At the right side of the figure, every other stack of semiconductor strips is terminated by the stairstep structures 202B, 203B, 204B, 205B; and every other stack of semiconductor strips is terminated by a separate source line. At the left side of the figure, every other stack of semiconductor strips is terminated by the stairstep structures 212A, 213A, 214A, 215A; and every other stack of semiconductor strips is terminated by a separate source line.

Transistors are formed between the stairstep structures 212A, 213A, 214A and the word line 225-1. In the transistors, the semiconductor strip (e.g. 213) acts as the channel region of the device. SSL gate structures (e.g. 219, 209) are patterned during the same step that the word lines 225-1 through 225-n are defined. A layer of silicide (shown with slanting line fill) can be formed along the top surface of the word lines, the ground select lines, and over the SSL gate structures. The layer of memory material 215 can act as the gate dielectric for the transistors. These transistors act as string select gates coupled to decoding circuitry for selecting particular ridge-shaped stacks in the array.

Data lines and string select lines are formed at the metals layers ML1, ML2, and ML3 overlying the memory block. In a stacked structure, the metal layers include conductors that connect access lines from the blocks to peripheral circuits, and can be shared by the stacked blocks, and need not be replicated for every block.

In this example, the first metal layer ML1 includes conductors that connect to string select lines with a lengthwise orientation parallel to the semiconductor material strips. These ML1 string select lines are connected by short vias to different SSL gate structures (e.g., 209, 219).

The second metal layer ML2 includes conductors that connect to string select lines with a widthwise orientation parallel to the word lines. These ML2 string select lines are connected by short vias to different ML1 string select lines.

In combination, these ML1 string select lines and ML2 string select lines allow a string select line signal to select a particular stack of semiconductor strips.

The first metal layer ML1 also includes conductors that connect to two source lines with a widthwise orientation parallel to the word lines.

Finally, the third metal layer ML3 includes conductors that connect to bit lines with a lengthwise orientation parallel to the semiconductor material strips. Different data lines are electrically connected to different steps of the stairstep structures 212A, 213A, 214A, 215A and 202B, 203B, 204B, 205B. These ML3 data lines allow a bit line signal to select a particular horizontal plane of semiconductor strips.

Because a particular word line allows a word line to select a particular plane of memory cells, the threefold combination of word line signals, bit line signals, and string select line signals is sufficient to select a particular memory cell from the 3D array of memory cells.

FIG. 3 is a schematic diagram of an example vertical channel, three-dimensional (3D) memory block, as described in U.S. patent application Ser. No. 13/772,058, entitled "3D NAND Flash Memory," filed 20 Feb. 2013, which is incorporated by reference as if fully set forth herein. The memory block shown in FIG. 3 can be stacked as described herein. The memory block includes high density memory cells in the kernel 299, and decoding elements in the decoding element region 298.

The 3DVC memory block includes an array of NAND strings of memory cells, and can be a double-gate vertical channel memory array (DGVC). The memory block includes a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 3, a stack in the stacks 310 includes a bottom plane of conductive strips (GSL), a plurality of intermediate planes of conductive strips (WLs) ranging from WL0 to WLN-1, and a top plane of conductive strips (SSLs), where N can be 8, 16, 32, 64 and so on.

The plurality of bit line structures are arranged orthogonally over, and have vertical extensions conformal with, the plurality of stacks, including vertical inter-stack semiconductor body elements 320 between the stacks and linking elements 330 over the stacks connecting the inter-stack semiconductor body elements 320. The linking elements 330 in this example comprise a semiconductor, such as polysilicon, having a relatively high doping concentration so that they have higher conductivity than the inter-stack semiconductor body elements 320, which are configured to provide channel regions for the cells in the stacks.

The memory device includes charge storage structures in interface regions at cross-points 380 between side surfaces of the conductive strips in the plurality of intermediate planes (WLs) in the stacks and the inter-stack semiconductor body elements 320 of the plurality of bit line structures. In the illustrated example, the memory cells in the cross-points 380 are configured in vertical, dual-gate NAND strings, where the conductive strips on both sides of a single inter-stack semiconductor body element behave as dual-gates, and can be operated cooperatively for read, erase and program operations.

The memory device includes string select switches 390 at interface regions with the top plane of conductive strips, and reference select switches 370 at interface regions with the bottom plane (GSL) of conductive strips. The dielectric layers of the charge storage structure can act as gate dielectric layers for the switches 370, 390 in some examples.

A reference conductor 360 is disposed between the bottom plane (GSL) of conductive strips and the integrated circuit substrate (not shown). This conductor might be placed at the bottom of a stack of memory blocks, and shared by the blocks in the stack. In one embodiment, in order to reduce the resistance of the reference conductor 360, the memory device can include a bottom gate 301 near the reference conductor 360. During read operations, the bottom gate 301 can be turned on by a suitable pass voltage applied to an underlying doped well or wells in the substrate, or other underlying patterned conductor structures, to increase the conductivity of the reference conductor 360.

A decoding element in the decoding element regions includes a reference line structure arranged orthogonally over the plurality of stacks, including inter-stack vertical conductive elements 340 between the stacks in electrical communication with the reference conductor 360, and linking elements 350 over the stacks 310 connecting the inter-stack vertical conductive elements 340. The inter-stack vertical conductive elements 340 can have a higher conductivity than the inter-stack semiconductor body elements 320.

A stack of memory blocks like that shown in FIG. 3, includes a first overlying patterned conductive layer (not shown) connected to the plurality of bit line structures, including a plurality of global bit lines coupled to page buffers and other decoding circuitry. The memory device also includes a second overlying conductive layer (not shown), which can be patterned, and can be above or below the first patterned conductive layer. The second overlying conductive layer is connected to the at least one reference line structure, such as by contact to the linking element 350 in the decoding element region of the block. The second patterned conductive layer can connect the at least one reference line structure to a reference voltage source, or to circuitry for providing a reference voltage.

In the example shown in FIG. 3, the linking elements 330 of the bit line structures include N+ doped semiconductor material. The inter-stack semiconductor body elements 320 of the bit line structures include lightly doped semiconductor material. In the example shown in FIG. 3, the reference conductor 360 includes N+ doped semiconductor material, and the linking elements 350 of the at least one reference line structure include N+ doped semiconductor material. The inter-stack vertical conductive elements 340 of the at least one reference line structure also include N+ doped semiconductor material. In alternative implementations a metal or metal compound can be used in place of the doped semiconductors in the inter-stack vertical conductive elements 340.

The decoding elements in decoding element region 298 include stairstep structures providing pad areas in the conductive strips for the horizontal word line and GSL line structures, configured for staircase contacts to overlying decoding circuits. String selection lines in the top plane of conductive strips are independently coupled to and controlled by the string selection line decoding circuits. The stairstep structures 361 and 362 provide pad areas connecting sets of word lines in the intermediate planes (WL), and interlayer connectors, such as interlayer connectors 371 and 372, coupled to landing areas in the linking elements that consist of stairstep structures 361 and 362, where the linking elements include openings through which interlayer connectors coupled to landing areas in lower intermediate planes extend. The landing areas are at interface regions between bottom surfaces of the interlayer connectors and top surfaces of the linking elements.

As illustrated in FIG. 3, interlayer connectors for sets of word lines at multiple layers in the plurality of intermediate planes are arranged in a staircase structure. Accordingly, interlayer connectors 371 and 372 are connected to landing areas at respective different layers in the plurality of intermediate planes. The staircase structure can be formed in a decoding element region near the boundary of a region for the block of NAND strings of memory cells and a region for peripheral circuits.

In the example shown in FIG. 3, the memory device includes linking elements, such as a linking element 363 in the decoding element region 298, connecting sets of ground selection lines in the bottom plane (GSL) of conductive strips, and interlayer connectors, such as an interlayer connector 373, coupled to landing areas in the linking elements in the bottom plane, where the interlayer connectors extend through the openings in the linking elements in the intermediate planes (WLs). The landing areas are at interface regions between bottom surfaces of the interlayer connectors, such as an interlayer connector 373, and top surfaces of the linking elements, such as a linking element 363.

FIGS. 4-9 show stages of a manufacturing process for stacking 3D memory blocks showing formation of the interlayer connectors in a stairstep structure in the decoding element regions of the blocks. The sequence of steps is similar for other conductors which are used to connect decoding elements in the decoding element regions of the stacked blocks.

Figure 4:
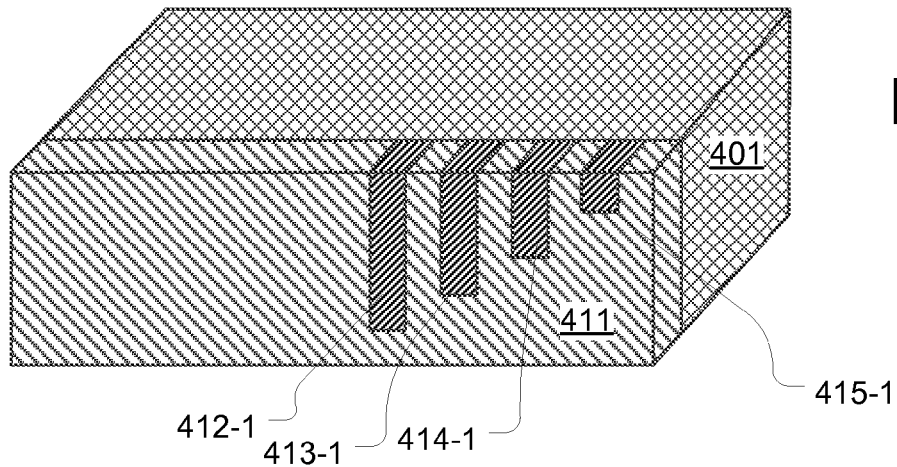
FIGS. 4-9 illustrate stages of a manufacturing process for stacking 3D memory blocks as described herein.

FIG. 4 illustrates a structure after forming a first memory block, the first memory block including a memory kernel 401 having a plurality of layers of memory cells (e.g. four layers), and a decoding element region 411 that includes decoding elements coupled to the memory kernel. Vertical segments 412-1, 413-1, 414-1, 415-1 are formed within the decoding element region 411, which connect to landing areas on stairstep structures (not shown) as shown for example in FIG. 2. The memory block shown in FIG. 4 can be manufactured using processes such as those described in a number of the applications which have been incorporated by reference herein. A block manufactured as shown with respect FIG. 2, and having four vertical segments 412-1, 413-1, 414-1, 415-1 connecting to stairstep structures in the decoding element region 411, can have the four planes of memory cells in the kernel 401. In a stacked structure, the width of the block can be greater than the width required for the space of the vertical segments 412-1, 413-1, 414-1, 415-1, increasing the number of columns of memory cells in each layer that can be coupled to each of the vertical segments.

Figure 5:
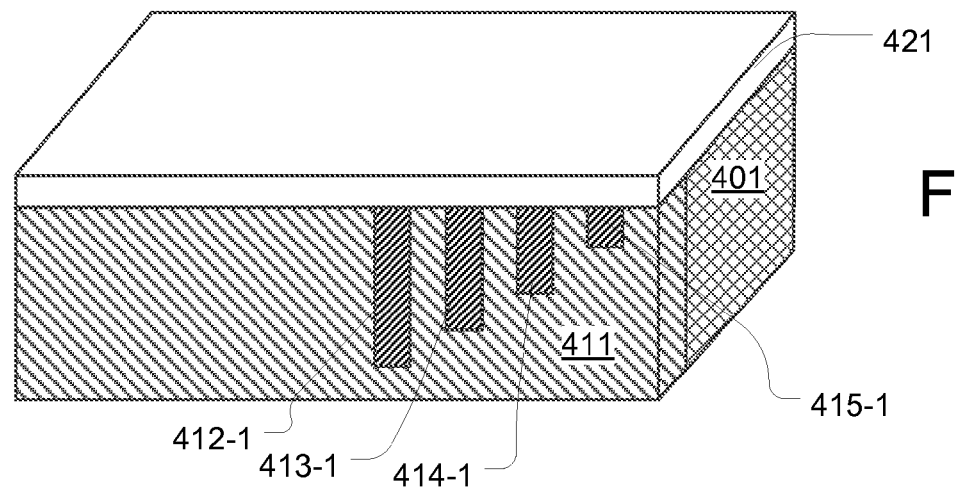

FIG. 5 illustrates the structure after forming an isolation layer 421 over the first memory block. The isolation layer 421 can be made using silicon dioxide or other insulating materials compatible with integrated circuit manufacturing.

Figure 6:
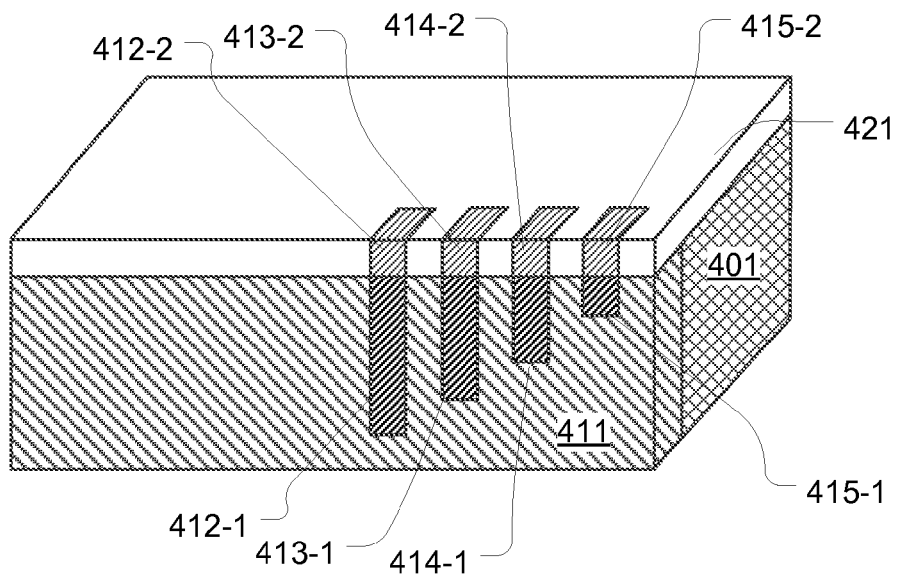

FIG. 6 shows the structure after forming second segments 412-2, 413-2, 414-2, 415-2 of the vertical conductors over the decoding element region 411, which contact the first segments 412-1, 413-1, 414-1, 415-1 of the vertical conductors. The second segments 412-2, 413-2, 414-2, 415-2 can be made with a relatively large design rule compared to that used inside the memory kernel 401, thereby allowing for ease of alignment and more reliable manufacturing.

Figure 7:
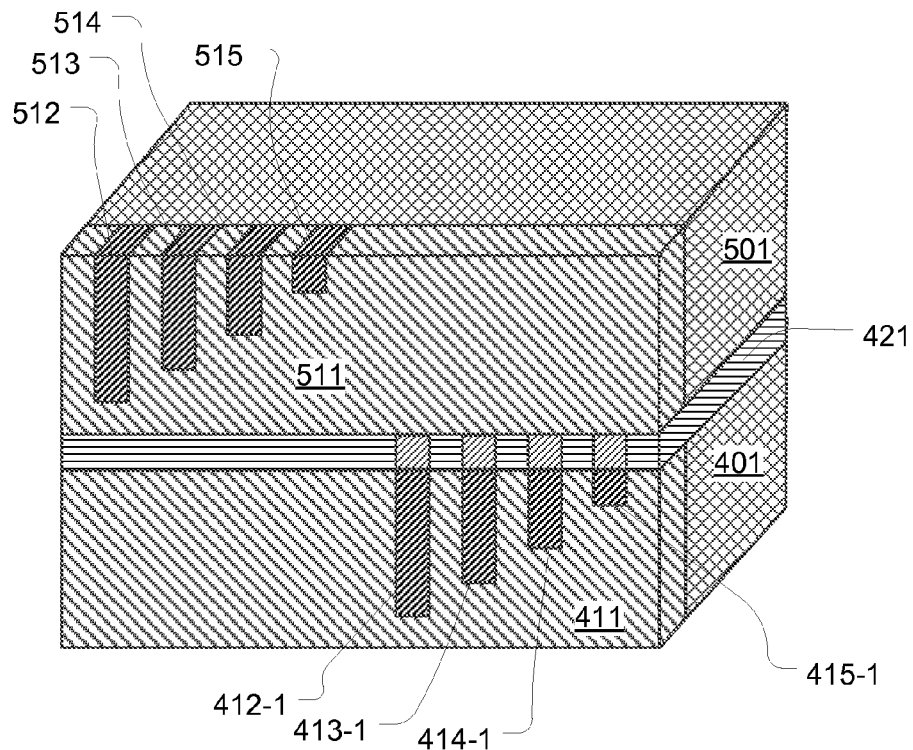

FIG. 7 illustrates the structure after forming a second memory block on the isolation layer 421, the second memory block including a memory kernel 501 having a plurality of layers of memory cells, and decoding elements in a decoding element region 511 coupled to the memory kernel 501. Vertical segments 512, 513, 514, 515 are formed within the decoding element region 511, which connect to landing areas on stairstep structures (not shown) as shown for example in FIG. 2. As with the first block, the use of four vertical segments 512, 513, 514, 515 supports four planes of memory cells when the kernels are made as described with reference to FIG. 2.

Figure 8:
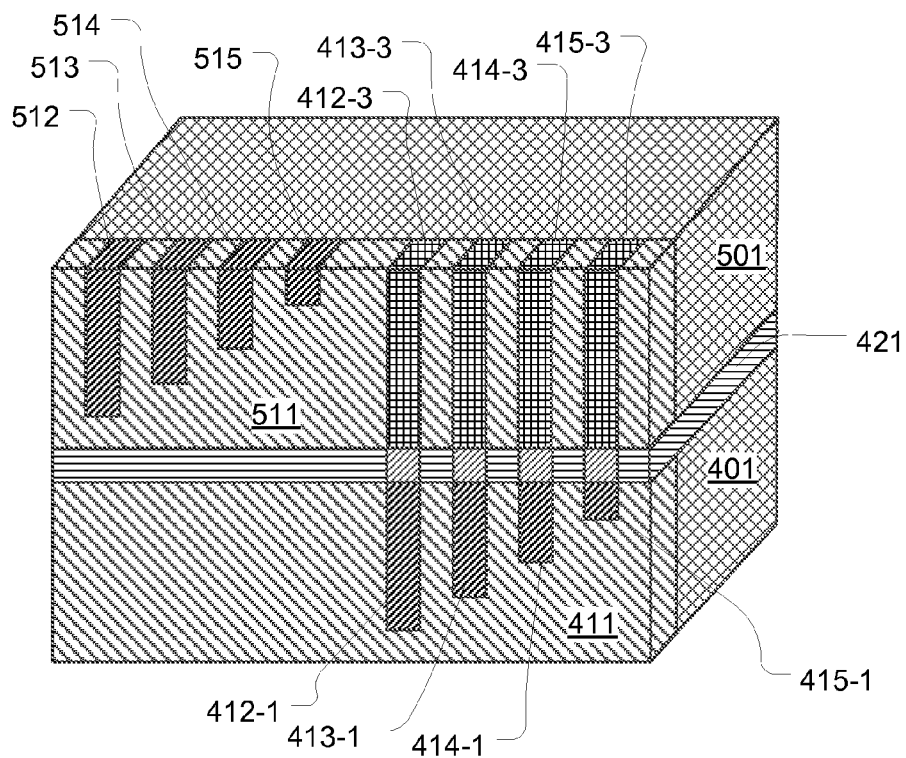

FIG. 8 illustrates the structure after forming third segments 412-3, 413-3, 414-3, 415-3 in the decoding element region 511 of the second block which are aligned with and contact the second segments 412-2, 413-2, 414-2, 415-2 of the vertical conductors in the isolation layer 421 over the decoding element region 411. The first segments 412-1, 413-1, 414-1, 415-1 of the vertical conductors which are within the decoding element region 411, combined with the corresponding second segments and third segments, establish vertical connection from the stairstep structure in the first block through the decoding element region 511 in the second block.

Figure 9:
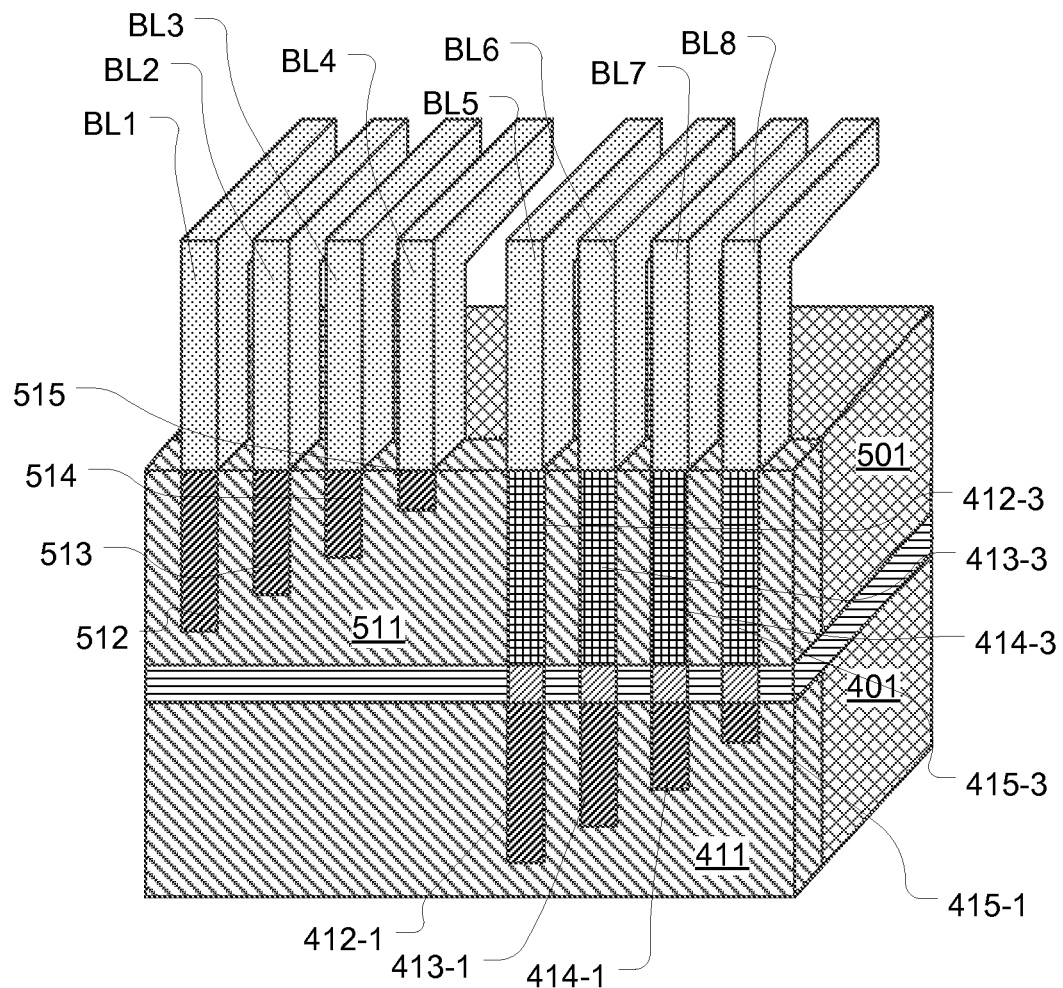

FIG. 9 schematically represents the structure after backend processes are used to form overlying conductor structures which contact the vertical conductors in the decoding element region 511 of the top block. These overlying conductor structures in the illustrated example include the bit lines BL1 to BL8, which are coupled to page buffers and other decoding circuitry.

Figure 10:
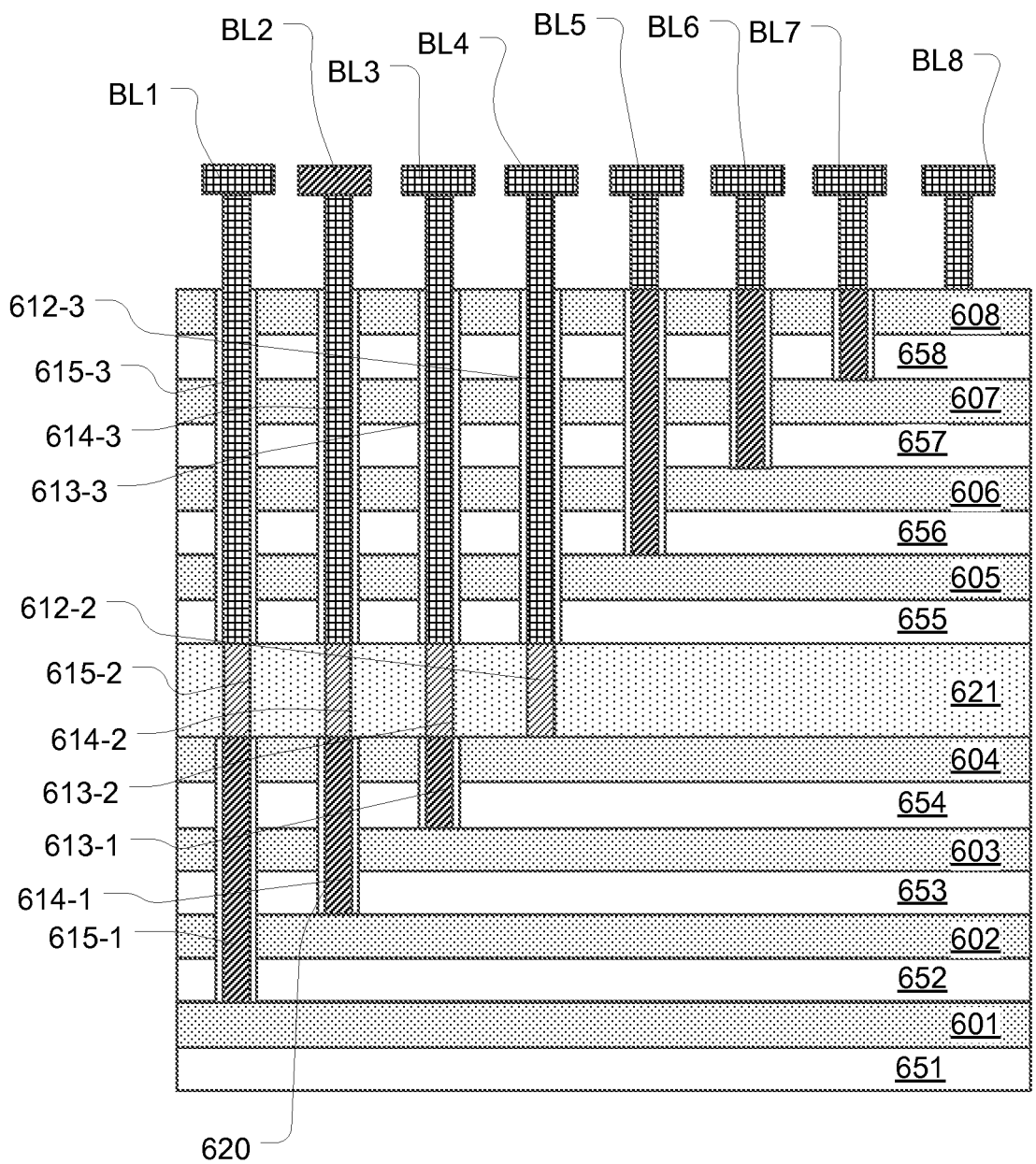
FIG. 10 illustrates a set of conductors that are connected to respective decoding elements such as stairstep landing areas, in the first and second blocks of a stack memory structure.

FIG. 10 is an end view of stairstep interlayer conductors in stacked blocks like those shown in FIG. 9. FIG. 10 shows active layers 601-604 and a first block and active layers 605-608 in a second block separated by isolation layer 621. Within the blocks, insulating layers 651-654 and insulating layers 655-658 separate active layers. In decoding element regions of the blocks, stairstep structures like those discussed above provide landing areas for interlayer conductors. Interlayer conductors in this example are implemented in the decoding element regions of the blocks without the strict design rule limitations of conductors formed inside the kernels of the blocks. Interlayer conductors for active layers 601-604 in the lower block can include three segments each. Thus, interlayer conductors are formed by segment 615-1 in the lower block which contacts the active layer 601, segment 615-2 in the isolation layer 621, and segment 615-3 which passes through the upper block. An isolation layer (e.g. 620) surrounds the interlayer conductors as they pass through overlying active layers. Also, the interlayer conductor for the active layer 602, includes segment 614-1 in the lower block, segment 614-2 in the isolation layer 621, and segment 614-3 in the upper block. The interlayer conductor for the active layer 603, includes segment 613-1 in the lower block, second segment 613-2 in the isolation layer 621, and segment 613-3 in the upper block. The interlayer conductor for the active layer 604 does not include a segment through the lower block, because the active layer is the uppermost layer in the block for this example. However, the interlayer conductor for active layer 604 includes segment 612-2 in the isolation layer 621, and the segment 612-3 in the upper block.

The interlayer conductors for the active layers 605-608 in the upper block include single segment conductors (unlabeled) in this example.

As mentioned above, after formation of the interlayer conductors in the decoding element regions of the blocks, back end processes are used to implement overlying patterned conductive layers, such as bit line structures BL1 through BL8.

The multi-segment interlayer conductors shown in FIG. 10, which contact active layers in the lower block do not electrically connect with decoding elements or memory cells in the upper block but provide data lines, or in some embodiments control lines, for the lower block only.

Figure 11:
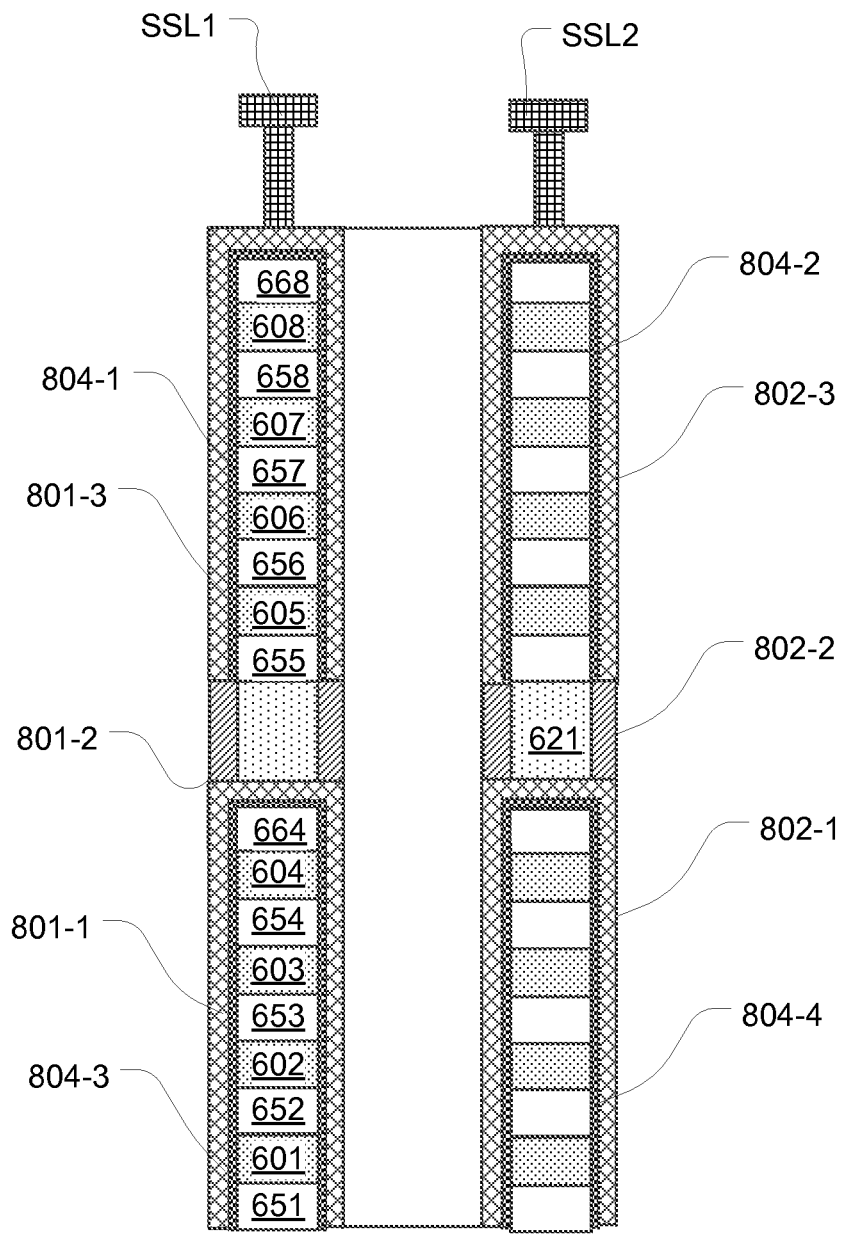
FIG. 11 illustrates a set of conductors that are coupled to decoding elements in each layer of a stack of 3D memory blocks.
Figures 12, 13:
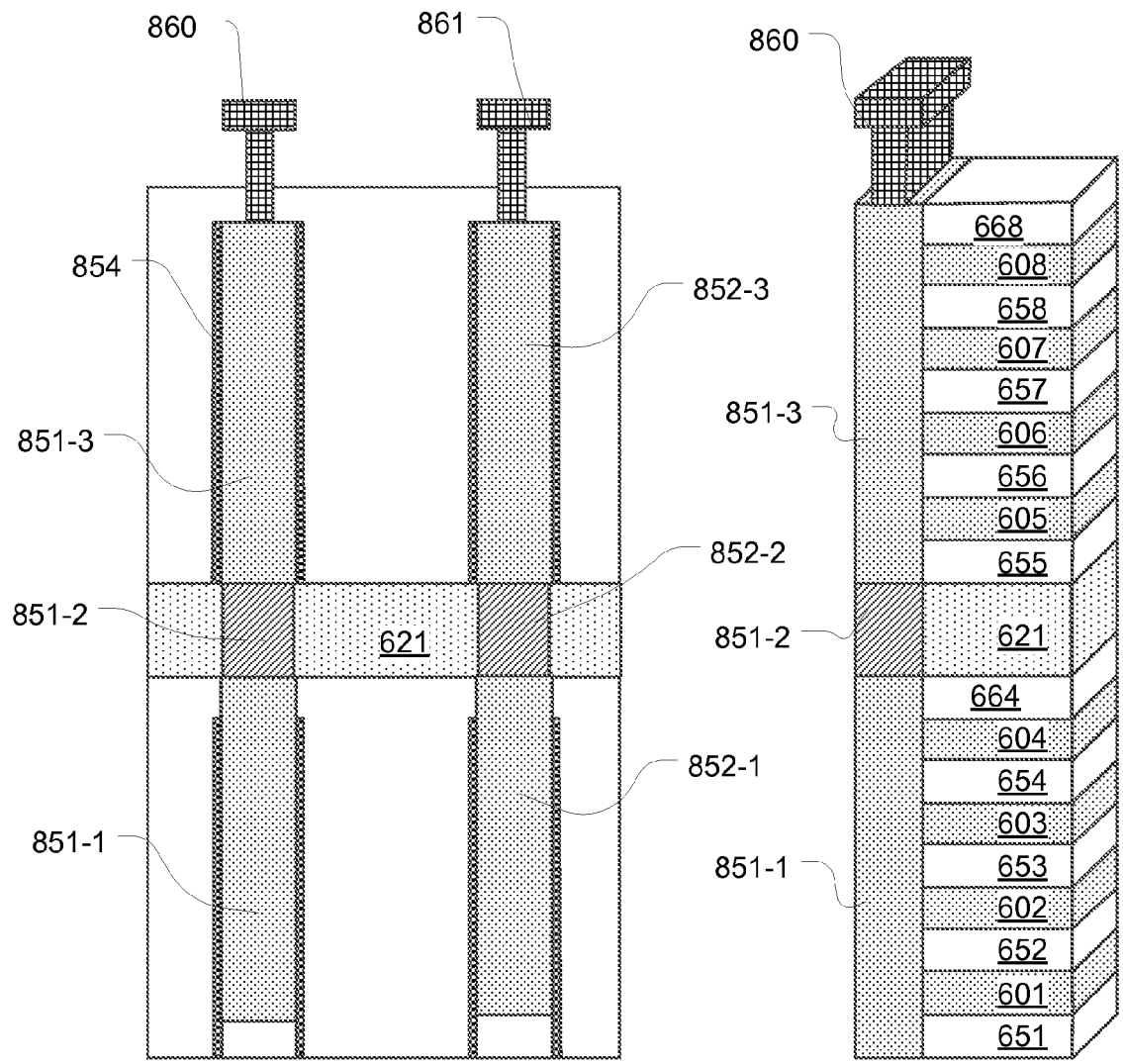
FIGS. 12 and 13 show end view and side view drawings of a set of conductors, such as source line conductors, which are coupled to decoding elements in all layers of a stack of 3D memory blocks.
Figure 14:
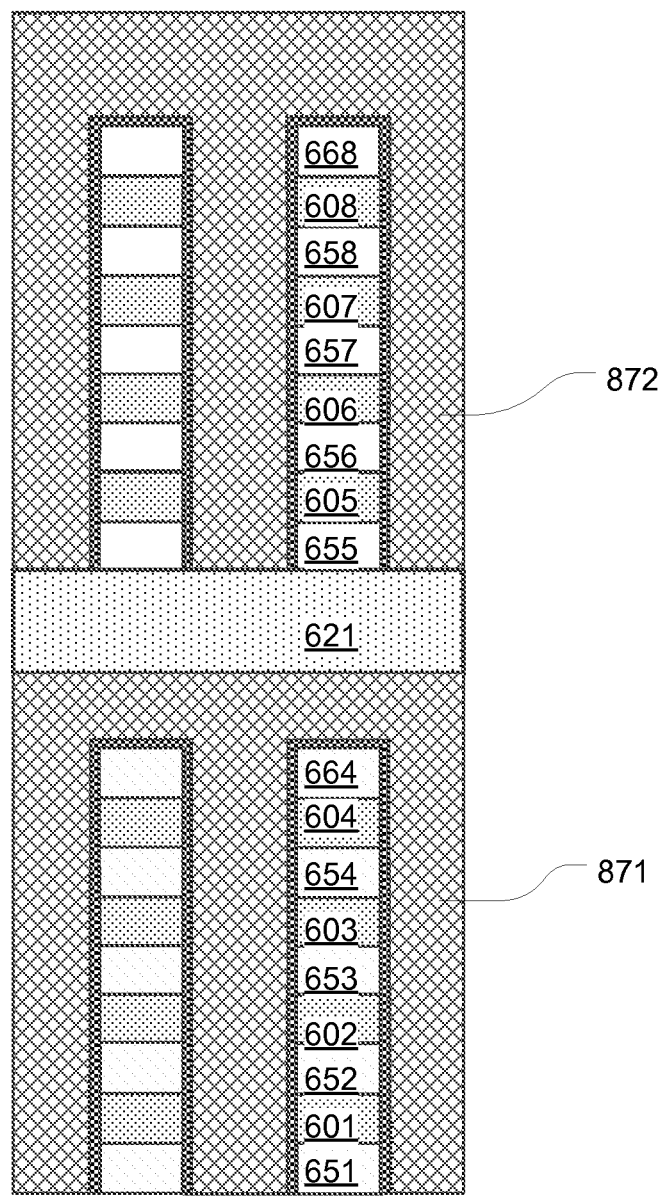
FIG. 14 illustrates conductors that are coupled to decoding elements in 3D memory blocks, but which are not connected with corresponding conductors in other blocks in the stack.

FIGS. 11-14 illustrate other types of connectors for decoding elements in the memory blocks. FIG. 11 shows a structure for string select line SSL structures, like the SSL gate structure 219 in the decoding element region 198 of FIG. 2. FIGS. 12 and 13 illustrate a structure for a source line, such as the source line 228 in the decoding element region 199 of FIG. 2. FIG. 14 illustrates a structure for a gate select line GSL, such as the gate select line 227 in the decoding element region 199 of FIG. 2.

FIG. 11 shows two SSL structures, which are connected respectively to conductor SSL1 and conductor SSL2 for connection to peripheral circuitry used for control of the memory. At the SSL structures, the active layers comprise active strips in respective stacks. Thus, in the SSL structure coupled to SSL1, strips for the active layers 601-604 in the first block are separated by insulating layers 651-654, with overlying insulating layer 664 in this example. Also, strips for the active layers 605-608 in the second block are separated by insulating layers 655-658, with overlying insulating layer 668 in this example. A dielectric layer (804-1, 804-2, 804-3, 804-4), which can be a multilayer stack that is used also in the memory kernel as the dielectric charge storage structure, is disposed as a gate insulator between the SSL structure and the strips. The SSL gate structure which is coupled to SSL1 includes a first segment 801-1 which overlies the stack in the lower block, a second segment 801-2 which extends through the isolation layer 621, and the third segment 801-3 which overlies the stack in the upper block. Overlying metal structures form the conductor SSL1. In a similar manner, the SSL structure coupled to SSL2 overlies strips for the active layers in the first and second blocks. The SSL structure includes a first segment 802-1 which overlies the stack in the lower block, a second segment 802-2 the which extends through the isolation layer 621 having two portions in this example that connect to opposing sides of the SSL structures in the decoding element regions of the blocks. A third segment 802-3 which overlies the stack in the upper block is connected to the second segment 802-2. The first segment 802-1 can be manufactured during manufacturing of the first block in a manner similar to the formation of the word lines, using a larger design rule to accommodate a decoding element. Likewise, the third segment 802-3 can be manufactured during the manufacturing of the second block using a larger design rule.

The SSL structures illustrated in FIG. 11 are examples of connections for lower block decoding elements that do not conduct data for the upper memory parts but can control the upper memory parts. Also, the SSL structures are examples of connections that extend from lower blocks through the decoding element region of the upper blocks.

FIG. 12 illustrates a source line structure which terminates the strips in the active layers with a connection to a reference voltage source, such as ground, or other reference voltage depending on the mode of operation and implementation of the device. The source line structure conducts current which is passing through the memory cells in some embodiments. FIG. 12 shows two source line structures, which are connected to respective overlying source line conductors 860 and 861 in a patterned conductive layer. The source line conductors 860, 861 provide for connection to decoding circuitry and other peripheral circuitry for operation of the device. A dielectric layer (e.g., 854), which can be a multilayer stack that is used also in the memory kernel as the dielectric charge storage structure, can be present on the sidewalls of the source line structures.

FIG. 13 shows that the strips of semiconductor material in the active layers 601-608 are terminated in the segments 851-1 and 851-3 of source line structures in the decoding element regions of the first and second blocks. The source line structure connected to conductor 860 includes a first segment 851-1 connected to the strips in the active layers 601-604 in the decoding element region of the lower block. Also, a second segment 851-2 passes through the isolation layer 621. A third segment 851-3 terminates the strips in the active layers 605-608 in the decoding region of the upper block. In a similar manner, the source line structure connected to the conductor 861, includes a first segment 852-1 in the decoding element region of the lower block, a second segment 852-2 passing through the isolation layer 621, and a third segment 852-3 in the decoding element region of the upper block.

The source line structure shown in FIGS. 12-13 provides for electrical connections carrying current of memory cells in the upper and lower memory blocks, such as a common source line. However, the structure resides in the decoding element region outside the kernel of the memory cells.

FIG. 14 illustrates yet another conductor which is disposed in the decoding element regions of the first and second blocks. In this example, a ground select line GSL structure like the GSL structure 226 in the decoding element region 198 of the structure in FIG. 2 is illustrated. The lower block includes a GSL line 871. The upper block includes a GSL line 872. There is no connection between the GSL line 871 and the GSL line 872 through the isolation layer 621. This allows for the GSL lines 871, 872 to be independently controlled if desired. Also, in other embodiments, the GSL lines 871, 872 might be electrically coupled to neighboring blocks arranged horizontally, or to other interconnect structures outside the memory blocks.

Thus, the GSL structure shown in FIG. 14 illustrates a connector for decoding elements which can be used to control operation of the memory blocks, and which is not coupled to overlying or underlying blocks in a stack.

Thus, a first set of conductors (e.g. stairstep data lines) is provided that is connected to decoding elements in the first and second blocks, and is disposed in the decoding element regions outside the memory kernels of the first and second blocks. The first set of conductors includes conductors disposed vertically in the decoding element regions which connect to decoding elements at respective layers in the first and second blocks.

Also a second set of conductors (e.g. SSL gates or source lines) is provided that is connected to decoding elements in the first and second blocks, and disposed within the first and second blocks outside the memory kernels. Each conductor in the second set of conductors includes vertical extensions which pass through all the layers in the first and second blocks.

Figure 15:
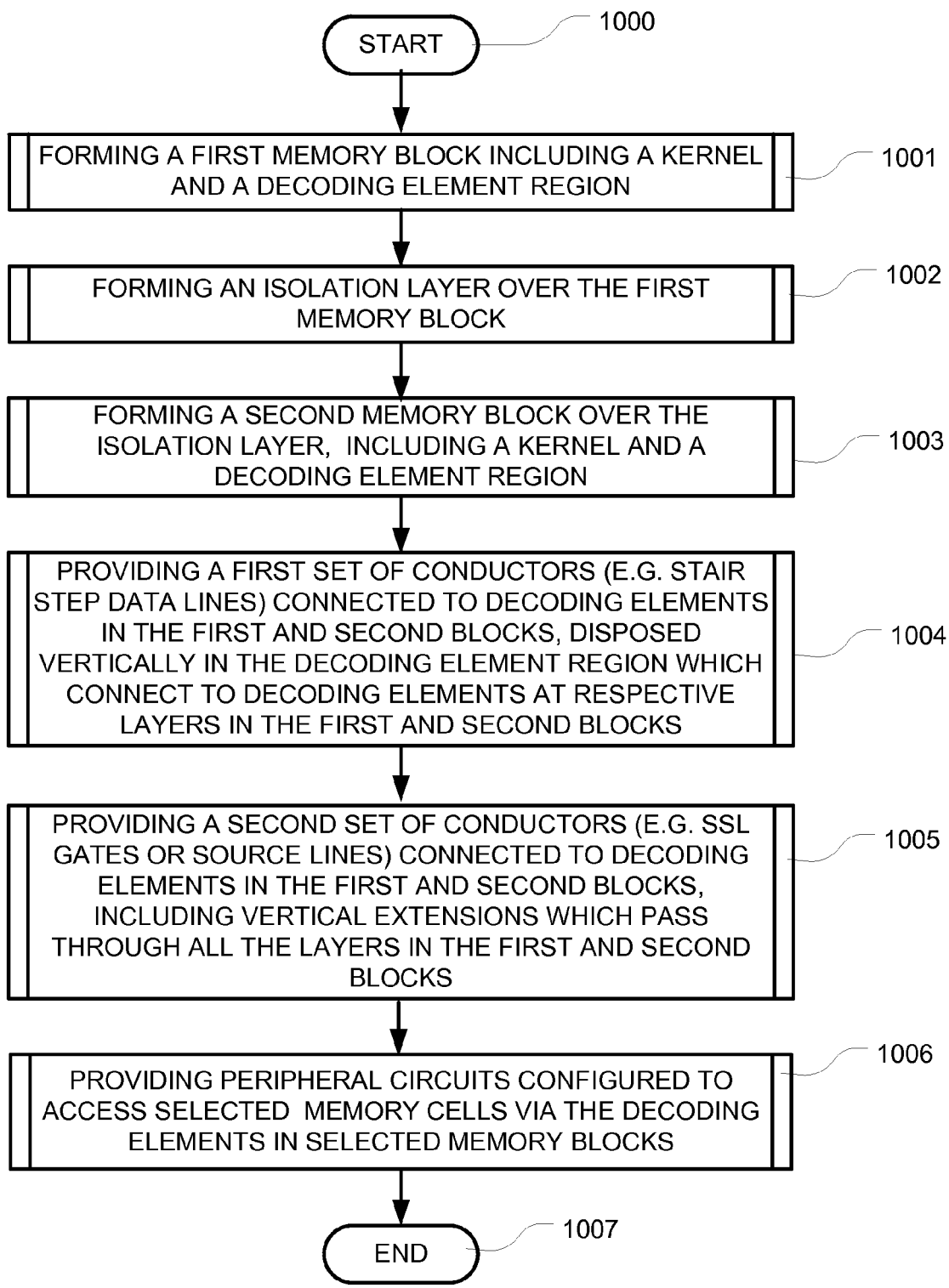
FIG. 15 is a simplified flowchart of the manufacturing process for forming a stack of 3D memory blocks as described herein.

FIG. 15 illustrates a basic manufacturing process for stacking blocks of memory cells. The flowchart starts with indicator 1000 wherein integrated circuit substrate is provided on which the stacked three-dimensional memory devices are to be formed. The process includes forming a first memory block that includes a kernel and a decoding element region, as discussed above (1001). Of course, many memory blocks can be formed in a first layer of blocks to provide for a large capacity high density memory. An isolation layer is formed over the first memory block (1002). The isolation layer provides a means for separating the kernel of the first block from the kernel of the second block. The isolation layer isolates the small design rule, high density features of the kernels in the stacked blocks in operation of the device. Next, a second memory block (or layer of second memory blocks) is formed over the isolation layer (1003). The second memory block includes a kernel and a decoding element region which are aligned over the corresponding regions of the first memory block.

The process includes providing access conductors coupled to the decoding elements in the first and second blocks. In the illustrated embodiment, the access conductors include a first set of conductors, such as stairstep data lines, which are connected to decoding elements in the first and second blocks, and disposed vertically in the decoding element regions of the blocks (1004). This first set of conductors provides for connection to decoding elements at respective layers of the first and second blocks, and does not contact or control elements in other blocks.

The access conductors implemented in the illustrated process also include a second set of conductors such as SSL gates or source lines, which are connected to decoding elements in the first and second blocks, and include vertical extensions which pass through all the layers in the first and second blocks (1005). This second set of conductors provides for connection to decoding elements in every layer of the first and second blocks, and can be used for control of decoding elements in both blocks.

The process can include formation of other conductors as discussed above.

In addition, according to the process illustrated, peripheral circuits configured to access selected memory cells via the decoding elements in selected memory blocks are provided, which utilize the first and second sets of conductors (1006).

Back-end-of-line BEOL processes are executed to complete the manufacturing of the device, so the flow chart ends with indicator 1007.

The flowchart is intended to provide a basic manufacturing process. The order steps can vary as suits the particular implementation. Likewise, the types of conductors implemented in the first set of conductors and in a second set of conductors depend on the particular embodiments of the memory blocks and decoding elements to be accessed.

Figure 16:
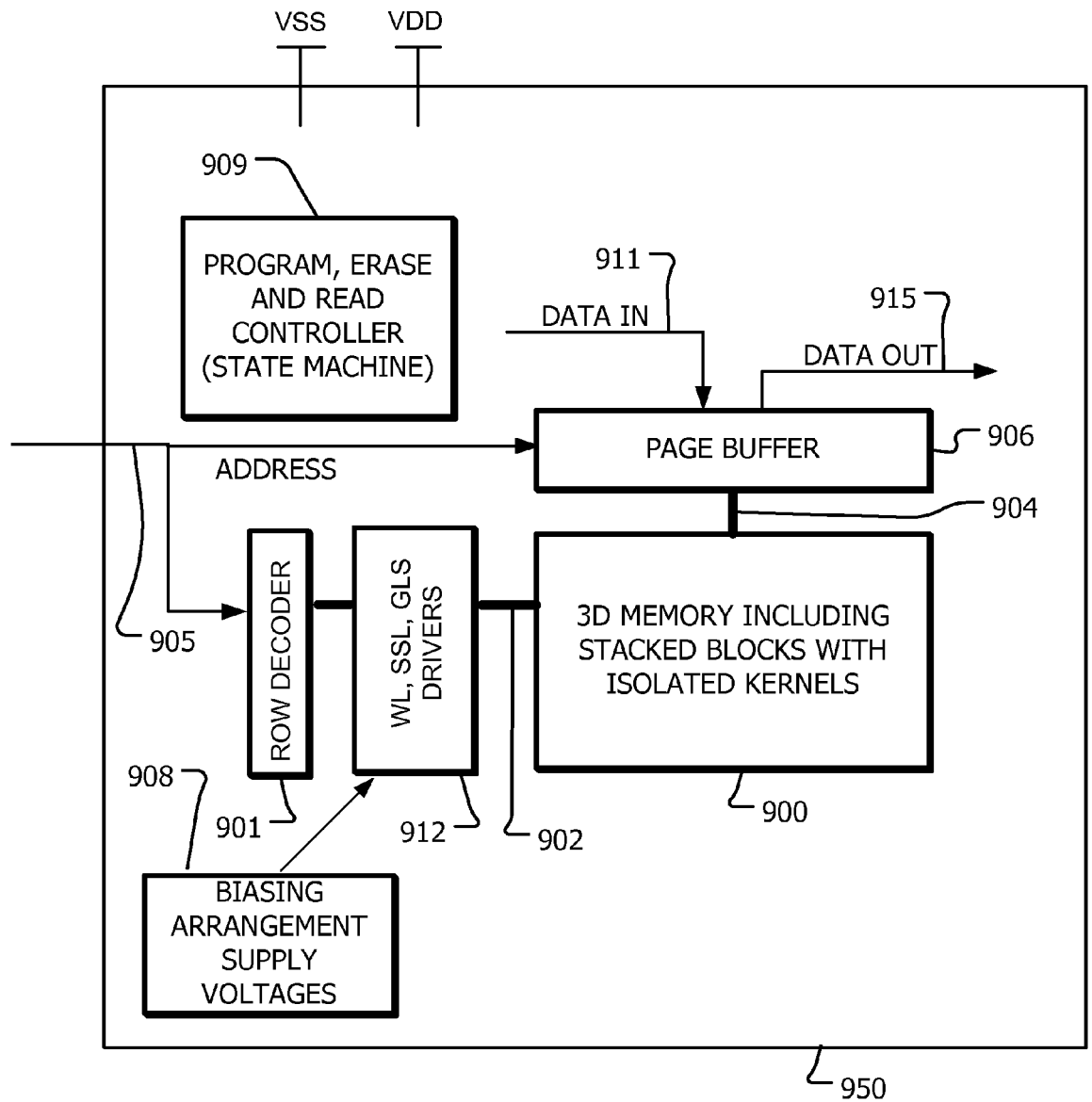
FIG. 16 is a simplified block diagram of an integrated circuit including a 3D memory with stacked blocks of memory cells having isolated kernels.

FIG. 16 is a block diagram of an integrated circuit including a 3D memory array having stacked blocks with isolated kernels as described herein, along with peripheral circuits used to access memory cells in the blocks, and for other purposes. A row decoder 901 is coupled to, and in electrical communication with, a string select line, a ground select line and word line drivers in block 912, which drive SSL, GSL and word lines 902 arranged along rows in the memory array 900.

A page buffer 906 is coupled to and in electrical communication with a plurality of bit lines 904 arranged along columns in the memory array 900 for reading data from, and writing data to, the memory cells in the memory array 900. Addresses are supplied on bus 905 to the row decoder 901 and to the page buffer 906. Data is supplied via the data-in line 911 from input/output ports on the integrated circuit 950, to the page buffer 906. Data is supplied via the data-out line 915 from the page buffer 906 to input/output ports on the integrated circuit 950, or to other data destinations internal or external to the integrated circuit 950. A state machine, clock circuitry and other control logic are in circuitry 909. Biasing arrangement supply voltages are generated in block 908, using charge pumps and other voltage sources, and are supplied to the word line drivers in block 912, and to other circuitry on the integrated circuit. The integrated circuit 950 includes terminals used to connect to a power supply, which provides the supply voltage VDD and VSS to the chip.

The integrated circuit 950 can include other peripheral circuits, not shown, such as processors, gate arrays, login circuitry and so one.

A 3D memory structure is described suitable for vertical gate and for vertical channel type 3D blocks. The structure includes a stack of 3D blocks having respective memory kernels and decoding element regions. Connections that extend through more than one block in the stack are disposed in decoding element regions only, outside the kernel, where a larger design rule can be enforced. The connections include connections that connect to decoding elements in only one block, but pass through overlying blocks in the decoding element regions. Also the connections can include connections that connect to decoding elements in the decoding element regions of all the blocks in a stack.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
a plurality of memory blocks, the memory blocks each including a memory kernel having a plurality of layers of memory cells and vertical conductors through the plurality of layers, and decoding elements coupled to the memory kernel, the plurality of memory blocks including a first block and a second block disposed over the first block;
an isolation layer between the first and second blocks to isolate the vertical conductors in the memory kernels of the first and second blocks;
access conductors coupled to the decoding elements in the first and second blocks; and
peripheral circuits coupled to the access conductors, and configured to access selected memory cells via the decoding elements in selected memory blocks.

2. The memory of claim 1, wherein the access conductors include:
a first set of conductors connected to decoding elements in the first and second blocks, and disposed in a decoding element region outside the memory kernels of the first and second blocks, the first set of conductors including conductors disposed vertically in the decoding element region which connect to decoding elements at respective layers in the first and second blocks; and
a second set of conductors connected to decoding elements in the first and second blocks, and disposed within the first and second blocks, each conductor in the second set of conductors including vertical extensions which pass through all the layers in the first and second blocks outside the memory kernels.

3. The memory of claim 1, wherein the access conductors include a particular conductor connected to decoding elements in the first and second blocks, and disposed within the first and second blocks, and the particular conductor includes a first segment connected to a decoding element in the first block, a second segment connected to a decoding element in the second block and nominally aligned with the corresponding first segment, and a third segment through the isolation layer to connect the second segment and the first segment.

4. The memory of claim 1, wherein the first set of conductors connect to the corresponding layers of the memory kernels at stairstep structures which include landing pads that extend horizontally into the decoding element region.

5. The memory of claim 1, wherein the access conductors include a particular conductor connected to decoding elements in the first block, the particular conductor including:
a first segment disposed adjacent the second block;
a second segment nominally aligned with the first segment disposed adjacent the first block and contacting a decoding element in the first block; and
a third segment through the isolation layer to connect the second segment and the first segment.

6. The memory of claim 1, wherein a conductor in the second set of conductors is operatively coupled to a decoding element in the first block and to a decoding element in the second block.

7. The memory of claim 1, wherein the kernels of the memory blocks include vertical word lines.

8. The memory of claim 1, wherein the kernels of the memory blocks include vertical channel lines.

9. The memory of claim 1, wherein the decoding elements of the memory blocks include vertical source lines, and wherein the vertical source lines in the first block are connected through the isolation layer to the vertical source lines in the second block.

10. The memory of claim 1, wherein the kernels comprise horizontal NAND strings, and the decoding elements included string select switches coupled to access conductors providing vertical string select lines, and wherein the vertical string select lines in the first block are connected through the isolation layer to the vertical string select lines in the second block.

11. The memory of claim 1, wherein the vertical conductors in the memory kernels have dimensions according to a first design rule, and the decoding elements in the memory kernels have dimensions according to a second design rule larger than the first design rule.

12. A method of manufacturing a memory, including:
forming a first memory block, the first memory block including a memory kernel having a plurality of layers of memory cells, and decoding elements coupled to the memory kernel;
forming an isolation layer over the first memory block;
forming a second memory block on the isolation layer, the second memory block including a memory kernel having a plurality of layers of memory cells, and decoding elements coupled to the memory kernel;
providing a first set of conductors connected to decoding elements in the first and second blocks, and disposed in a decoding element region outside the memory kernels of the first and second blocks, the first set of conductors including conductors disposed vertically in the decoding element region which connect to decoding elements at respective layers in the first and second blocks; and
providing a second set of conductors connected to decoding elements in the first and second blocks, and disposed within the first and second blocks outside the memory kernels, each conductor in the second set of conductors including vertical extensions which pass through all the layers in the first and second blocks.

13. The method of claim 12, wherein providing the second set of conductors includes forming first segments connected to decoding elements in the first block during said forming of the first memory block, forming interconnections through the isolation layer connected to corresponding first segments, and forming second segments connected to decoding elements in the second block and connected via the interconnections through the isolation layer with corresponding first segments.

14. The method of claim 12, including forming stairstep structures which include landing areas that extend horizontally into the decoding element region, and wherein the first set of conductors connect to the corresponding layers of the memory kernels at the landing areas.

15. The method of claim 12, wherein providing the first set of conductors includes forming first block conductors connected to decoding elements in the first block, the first block conductors including:
first segments disposed adjacent the second block and isolated from the second block;

second segments nominally aligned with the first segments disposed adjacent the first block and contacting corresponding decoding elements in the first block; and interconnections through the isolation layer to connect the first and second segments.

16. The method of claim 12, wherein a conductor in the second set of conductors is operatively coupled to a decoding element in the first block and to a decoding element in the second block.

17. The method of claim 12, wherein the kernels of the memory blocks include vertical word lines, and wherein the vertical word lines in the first block are connected in rows by horizontal lines, and not connected through the isolation layer to the vertical word lines in the second block.

18. The method of claim 12, wherein the kernels of the memory blocks include vertical channel lines, and wherein the vertical channel lines in the first block are connected in columns by horizontal lines, and are not connected through the isolation layer to the vertical channel lines in the second block.

19. The method of claim 12, wherein the decoding elements of the memory blocks include vertical source lines, and wherein the vertical source lines in the first block are connected through the isolation layer to the vertical source lines in the second block.

20. The method of claim 12, wherein the kernels comprise horizontal NAND strings, and the decoding circuits include string select switches coupled to vertical string select lines, and wherein the vertical string select lines in the first block are connected through the isolation layer to the vertical string select lines in the second block.

21. The method of claim 12, wherein the memory kernels of the first and second blocks include vertical elements having dimensions according to a first design rule, and at least some of the decoding elements of the first and second blocks have dimensions according to a second design rule larger than the first design rule.

22. The method of claim 12, including providing peripheral circuits configured to access selected memory cells via the decoding elements in selected memory blocks.

23. A memory comprising:
a plurality of memory blocks, the memory blocks each including a memory kernel having a plurality of layers of memory cells having vertical elements with layout view dimensions according to a first design rule, and decoding elements coupled to the memory kernel and having vertical elements with layout view dimensions according to a second design rule larger than the first design rule, the plurality of memory blocks including a first block and a second block disposed over the first block;

an isolation layer between the first and second blocks;

stairstep structures connected to decoding elements in the first and second memory blocks, the stairstep structures including landing areas that extend horizontally into a decoding element region outside the first and second blocks;

a first set of conductors including conductors disposed vertically in the decoding element region which connect to landing areas in the stairstep structure at respective layers in the first and second blocks;

a second set of conductors connected to decoding elements in the first and second blocks, and disposed within the first and second blocks, each conductor in the second set of conductors including vertical extensions which pass through all the layers in the first and second blocks outside the memory kernels; and peripheral circuits configured to access selected memory cells via the first and second sets of conductors in selected memory blocks.

24. The memory of claim 23, wherein the kernels of the memory blocks include vertical word lines, and wherein the vertical word lines in the first block are connected in rows by horizontal lines, and not connected through the isolation layer to the vertical word lines in the second block.

25. The memory of claim 23, wherein the kernels of the memory blocks include vertical channel lines, and wherein the vertical channel lines in the first block are connected in columns by horizontal lines, and are not connected through the isolation layer to the vertical channel lines in the second block.

26. The memory of claim 24, wherein the decoding elements of the memory blocks include vertical source lines, and wherein the vertical source lines in the first block are connected through the isolation layer to the vertical source lines in the second block.

27. The memory of claim 24, wherein the kernels comprise horizontal NAND strings, and the decoding circuits included string select switches coupled to vertical string select lines, and wherein the vertical string select lines in the first block are connected through the isolation layer to the vertical string select lines in the second block.

* * * * *